(12) United States Patent
Schmidt et al.

(10) Patent No.: US 11,022,993 B2
(45) Date of Patent: Jun. 1, 2021

(54) ENERGY SUPPLY APPARATUS

(71) Applicant: Phoenix Contact GmbH & Co. KG, Blomberg (DE)

(72) Inventors: Olaf Schmidt, Soest-Muellingsen (DE); Lars Alsdorf, Soest (DE); Hartmut Henkel, Blomberg (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 324 days.

(21) Appl. No.: 16/154,323

(22) Filed: Oct. 8, 2018

(65) Prior Publication Data
US 2019/0107859 A1    Apr. 11, 2019

(30) Foreign Application Priority Data
Oct. 9, 2017   (DE) .................... 10 2017 123 404.7

(51) Int. Cl.
*G05F 1/66* (2006.01)
*H02H 3/08* (2006.01)
(Continued)

(52) U.S. Cl.
CPC ......... *G05F 1/66* (2013.01); *G01R 19/16547* (2013.01); *G01R 21/133* (2013.01);
(Continued)

(58) Field of Classification Search
CPC .... H01H 71/74; H01H 85/0039; H01H 85/46; H02H 3/006; H02H 3/083; H02H 3/093; H02H 9/02; G01R 21/133; G01R 19/165; G01R 19/16547; H02J 3/00; H02J 3/001; G05F 1/66; G05F 1/70
See application file for complete search history.

(56) References Cited

U.S. PATENT DOCUMENTS 6,407,522 B1   6/2002   Andersson et al.
9,667,060 B1   5/2017   Sizikov
(Continued)

FOREIGN PATENT DOCUMENTS

AT   506 092 A4   6/2009
CN   102124619 A   7/2011
(Continued)

*Primary Examiner* — Matthew V Nguyen
(74) *Attorney, Agent, or Firm* — Holland & Hart LLP

(57) ABSTRACT

The disclosure relates to an energy supply apparatus for the overcurrent-protected electric power supply to an electric consumer, including a power supply device configured to provide an electric current for the electric consumer, and a controllable power protection element configured to disable a supply of electric current to the electric consumer when the electric current reaches a first current limit value, wherein the controllable power protection element comprises an adjustable second current limit value set by the power supply device, wherein the power supply device receives an increased power requirement of the electric consumer within a time interval and to control the controllable power protection element for a duration of the time interval to set the second current limit value, and wherein the controllable power protection element disables the supply of the electric current to the electric consumer upon reaching the second current limit value by the electric current.

15 Claims, 2 Drawing Sheets

(51) Int. Cl.
  *G01R 19/165* (2006.01)
  *G01R 21/133* (2006.01)
  *H02H 9/02* (2006.01)
  *H02J 3/00* (2006.01)
  *H01H 85/46* (2006.01)
  *H02H 3/00* (2006.01)
  *H01H 71/74* (2006.01)
  *H01H 85/00* (2006.01)
  *H02H 3/093* (2006.01)

(52) U.S. Cl.
  CPC .............. *H02H 3/08* (2013.01); *H02H 3/083* (2013.01); *H02H 9/02* (2013.01); *H02J 3/00* (2013.01); *H01H 71/74* (2013.01); *H01H 85/0039* (2013.01); *H01H 85/46* (2013.01); *H02H 3/006* (2013.01); *H02H 3/093* (2013.01); *H02J 3/001* (2020.01)

(56) References Cited

U.S. PATENT DOCUMENTS 10,712,426 B2 * 7/2020 Herring .................... H04B 1/18
2002/0080544 A1 * 6/2002 Pellegrino ............. H02H 3/025
  361/93.9
2009/0109590 A1 4/2009 Girot et al.
2010/0214709 A1 8/2010 Hall et al.
2014/0268459 A1 9/2014 Robinson et al.
2015/0033040 A1 1/2015 Zhou
2015/0331463 A1 * 11/2015 Obie ........................ G06F 1/266
  713/300

FOREIGN PATENT DOCUMENTS

| CN | 102315619 A | 1/2012 | |
|----|----|----|----|
| CN | 106030951 A | 10/2016 | |
| DE | 3902416 A1 | 8/1990 | |
| DE | 198 35 781 A1 | 2/2000 | |
| DE | 103 59 736 A1 | 7/2005 | |
| DE | 20 2009 005 420 U1 | 7/2009 | |
| DE | 10 2008 064 393 A1 | 7/2010 | |
| DE | 102018114129 A1 * | 12/2019 | ............. H02H 3/385 |
| EP | 1 058 365 A2 | 12/2000 | |
| EP | 1 186 086 | 3/2002 | |
| WO | WO 00/74196 A1 | 12/2000 | |

* cited by examiner

US 11,022,993 B2

ENERGY SUPPLY APPARATUS

CROSS-REFERENCE TO RELATED APPLICATIONS

This application claims priority to German patent application No. 10 2017 123 404.7, entitled "Energieversorgungsvorrichtung", and filed on Oct. 9, 2017 by the Applicant of this application. The entire disclosure of the German application is incorporated herein by reference for all purposes.

BACKGROUND

The disclosure relates to an energy supply apparatus for the overcurrent-protected supply of electric power to an electric consumer.

In an energy supply apparatus, a power supply device can be combined with a circuit breaker, which for example disables or limits the transport of electric energy from the power supply device to the electric consumer when the current flowing from the power supply device to the electric consumer reaches a current limit value.

The circuit breaker is normally set statically at a predetermined current value or a predetermined power value. The predetermined current limit value or power limit value corresponds typically to a permanent, especially to a permanently non-destructive electric current or power that can be accepted by the electric consumer. The electric consumer can however, during an interval in time, functionally exceed the predetermined current limit value or power limit value. A disadvantage of this exceedance is that it can trigger the circuit breaker and interrupt or limit the supply of electric energy to the consumer by the power supply device so that the functioning of the electric consumer can be restricted.

SUMMARY

The task of the object of the present disclosure is to provide an improved energy supply apparatus for more efficiently providing electric energy for an electric consumer. This object is solved by the features of the independent claims. Beneficial examples of the disclosure are a constituent part of the dependent claims, of the description and of the accompanying drawings.

The disclosure is based on the knowledge that the above object can be solved by an energy supply apparatus, which combines a power supply device with a circuit breaker, which comprises a variable current limit. The circuit breaker can limit or disable an electric current flowing from the power supply device to the electric consumer or the current flowing if the current limit value is exceeded. The current limit value can be raised for a limited time to permit a current to flow with a higher value during this period without the value of the current being limited or the flow of current being disabled.

According to a first aspect, the disclosure relates to an energy supply apparatus for the overcurrent-protected supply of electric power to an electric consumer. The energy supply apparatus comprises a power supply device that is configured to provide electric current for the electric consumer and a controllable power protection element configured to disable the supply of the electric current to the electric consumer when the electric current reaches a first current limit value. The controllable power protection element further comprises an adjustable second current limit value which can be set by the power supply device, wherein the second current limit value is greater than the first current limit value. The power supply device is further configured to receive an increased power requirement of the electric consumer within a time interval and, in response to the reception of the increased power requirement, control the controllable power protection element for the duration of the time interval for setting the second current limit value, wherein the controllable power protection element is configured, at the setting of the second current limit value, to disable the supply of electric current to the electric consumer when the current reaches the second current limit value.

The power supply device can comprise an electric energy source, especially a switched-mode power supply, which can be connected via a power supply connection to an external energy supply network or to an internal energy store. For this, the power supply device can comprise connections for electric cables, especially in the form of plug-in, screw, or clamp connectors. In addition, the disconnection of the electric connection to the electric consumer can be realized by means of a plug-in, screw, or clamp connector.

The energy supply apparatus can be configured permanently so that it operates with a current having a value less than the first current limit value, wherein further parameters, in addition to the first current limit value, can be determined for the transport of power from the power supply device to the electric consumer. Allowable areas for a current frequency, a current phase and/or an electric voltage of the electric current, for example, can be defined.

The limiting or disabling of the current flow from the power supply device via a current supply cable to the electric consumer by means of the controllable power protection element can be realized on reaching a single limit value of the previously mentioned limit values or a combination of limit values of the previously mentioned limit values. For example, the limitation or disabling of the current flow on reaching a predetermined electric power can be realized by means of a combination of the voltage limit value and the current limit value.

The energy supply apparatus can be configured to be operated with the second current limit value for a limited time, wherein the second current limit value can be defined by the type of the electric consumer. A boost mode for the supply of the electric consumer with excess current can be especially realized using the second current limit value, wherein the excess current can have an increased current value via the first current limit value.

This excess current can be used to define the securing of the electric consumer and/or a fast release in order to disable the flow of electric current with a current value greater than the second current limit value. Allowing the flow of the excess current can also be prevented by a collapse of the electric voltage at the electric consumer so that protection devices, especially magnetically activated protection devices, can trigger reliably.

If the second current limit value is set by the controllable power protection element to a previous point in time and the first current limit value is set to the present time, the power supply device can be configured to prevent the setting of the second current limit value. This results in the beneficial effect of preventing the controllable power protection element being permanently set to the second current limit value.

In one example, the power supply device is configured to control the controllable power protection element for setting the first current limit value once the time interval for setting the first current limit value has elapsed, and the controllable power protection element is configured, with adjusted first current limit value, to prevent the supply of the electric current from the electric consumer upon reaching the first current limit value by the electric current.

The electric consumer can be configured, for a limited period, to require an electric current with a value greater than the first current limit value and therefore require an electric power greater than the realizable electric power with the first current limit value from the energy supply apparatus. The time interval in which the controllable power protection element sets the second current limit value can be beneficially limited in order to protect the energy supply apparatus and/or electric consumer against overload.

Once the especially predefined and/or limited time interval has elapsed, the controllable power protection element can set the first current limit value so that the electric current flowing via the current supply cable can be limited to the first current limit value. The current value can lie below the second current limit value and above the first current limit value so that, with a setting change from the first current limit value to the second current limit value, the controllable power protection element can trigger in order to prevent current flowing to the electric consumer or limit the value of the current.

In one example, the power supply device is configured to control the controllable power protection element for setting the first current limit value by acquiring a value of the supply current which lies below the first current limit value. This has the benefit that the power supply device can switch between the first current limit value and the second current limit value of the controllable power protection element. The power supply device can be configured, to perform changeover from the second current limit value to the first current limit value after the expiry of the time interval, on dropping below the first current limit value, on user input, on a reset of the energy supply apparatus and/or on a reboot of the energy supply apparatus.

In one example, the power supply device is configured to detect the higher power requirement for an increasing current amplitude of the electric current. This brings the benefit that the second current limit value can be set even before the first current limit value can be exceeded. The increasing current amplitude can for example be acquired by determining the current amplitude difference between two different points in time.

In one example, the power supply device is configured to detect the increased power requirement during an increasing current amplitude of the electric current if an amplitude increase does not exceed a predefined increment limit value. This has the benefit that a changeover in current limit value can also take place when the current increases slowly or is not measureable.

In one example, the controllable power protection element comprises a current path which can be implemented by the electric current, and the controllable power protection element is configured to set the first current limit value or the second current limit value in the current path. The current path can be connected to the electric consumer in order to supply the electric consumer via the current path with secured and/or limited electric power.

In one example, the controllable power protection element comprises a controllable circuit breaker which is arranged in the current path, wherein the controllable circuit breaker is configured to set the first current limit value or the second current limit value. The controllable circuit breaker can be a fuse or an overcurrent protection device that can be especially useful for low-voltage networks. The circuit breaker especially can be a re-usable and/or non-automatic resetting safety element. The controllable circuit breaker can also be combined with a residual current protective device, wherein the residual current protective device can prevent or limit a current flow to an earthing potential of the energy supply apparatus. The overcurrent device can also be a destructible fusible link.

In one example, the controllable power protection element comprises a first current path with the first current limit value and a second current path with the second current limit value, wherein the controllable power protection element is configured to interrupt the second current path for setting the first current limit value and/or the first current path for setting the second current limit value. This brings the benefit that the controllable power protection element can set the first current limit value or the second current limit value by means of an electronic or mechanical switch by connecting the first current path or the second current path to the power supply device via the switch. In particular, this setting can be realised without further control logic, processor and/or electronic power components so that the manufacturing costs for the energy supply apparatus can be advantageously reduced. A switching element can be arranged in each current path or a switching element can switch from the first current path to the second current path and vice versa.

In one example, the controllable power protection element in the first current path comprises a first circuit breaker with the first current limit value and, in the second current path, a second circuit breaker with the second current limit value. This brings the benefit that the controllable power protection element can switch efficiently between the first current limit value and the second current limit value. An adjustment of the particular current limit value can also be realised in the relevant non-active current path without affecting the current flow in the particular active current path. A switchover to the other particular current limit value can, for example, be dependent on the switchover between the current paths; in particular the setting of the current limit values can be decoupled from the actual current flow.

In one example, the power supply device is configured to detect a boost mode of the electric consumer, in which the electric consumer has the increased power requirement within the time interval. This has the benefit that the electric consumer, especially in the short term, can accept an increased quantity of energy in order to, for example, overcome a start-up resistance of an electric motor or of an electric generator. Short-term load peaks of an arbitrary electric consumer can also be supplied by the power supply device within the time interval.

The detection of the boost mode can also be used during an overcurrent, especially a short circuit, to maintain the electric voltage provided by the power supply device. This brings the benefit that the magnetically activated short-circuit fuses in particular are reliably triggered.

In one example, the controllable power protection element is configured to carry the electric current with a value that is a multiple of the value of the electric current outside the boost mode, especially 1.5, 2, 5, or 10 times.

In one example, the power supply device comprises a power monitor that is configured to monitor the power requirement in order to record the increased power requirement. With that, the benefit is obtained that the power supply device can control the controllable power protection element more efficiently to enable a changeover from the first current limit value to the second current limit value or vice versa. The power supply device can, by means of power monitor, record whether a value of the electric current lies below the first current limit value and controls the controllable power protection element correspondingly, in order to change over from the second current limit value to the first current limit value, if the second current limit value is set. The power monitor can also be configured to record an electric power or a quantity of electric energy.

The power monitor can be configured to update the measured value of the power with a predetermined frequency, wherein it is advantageous when the sum of updating period and switching time from the first current limit value to the second current limit value can be less than the activation time of the controllable power protection element. The activation time describes a time delay between the flowing of an electric current with a value greater than the first current limit value or of the second current limit value. Thus, it can be advantageous that a switching over from the first current limit value to the second current limit value can be realised before the controllable power protection element interrupts the flow of current to the electric consumer.

In one example, the power supply device comprises a control output for outputting a control signal for setting the respective current limit value by the controllable power protection element, wherein the controllable power protection element comprises a control input and wherein the control output is connected to the control input and wherein the controllable power protection element is configured to set the relevant current limit value responding to the receipt of the control signal at the control input. This has the benefit that the control signal can be led efficiently from the power supply device to the controllable power protection element in order to switch over between the first current limit value and the second current limit value and vice versa. The control input and the control output can be connected together, either cordlessly or electrically isolated, in order to realise a potential-free electric connection between the control input and the control output.

In one example, the power supply device is configured to adapt the time interval in order to adjust the period in which the second current limit value is to be set by the controllable power protection element. This has the benefit that the energy supply apparatus can be adapted to electric consumers with different requirements for a time-limited, elevated power consumption.

In one example, the power supply device is configured to adjust the time interval, especially in a range from 0 s to 10 s. The time interval can be determined by parameters of the electric consumer. A power input to the electric consumer higher than the predefined limit values in the first operating mode can produce an additional load on the electric consumer and/or the power supply device, which can only be allowed, for example, for a limited period of time.

In particular a current level higher than the first current limit value can generate an additional heat load on the power supply device and/or the electric consumer, which can exceed the heat removal capacity of the power supply device and/or of the electric consumer. A restriction on the elevated current value to a predetermined time interval has the advantage that the power supply device and/or the electric consumer can return to a thermal and/or electric equilibrium after expiry of the time interval.

Furthermore, the power supply device, the controllable power protection element and/or the current supply cable each comprises an ohmic resistance so that an electric power loss can occur which is converted to heat and the temperature of the energy supply apparatus can rise if the heat input is greater than the heat dissipated to the surroundings of the energy supply apparatus. This is especially possible in the case of a set second current limit value. The electric power loss can be proportional to the level of current of the electricity flowing through the energy supply apparatus so that the temperature of the energy supply apparatus can be used as a measure for the level of current in the electricity flowing.

In one example, the power supply device comprises a power adapter which is configured to take electric power from a power supply network and provide the electric power to the electric consumer. The power adapter can be configured to transform a voltage made available from an energy supply network into an electric voltage permitted for the electric consumer. The power adapter can be configured especially to raise the voltage, to reduce and/or rectify the voltage. The power adapter can have a fixed setting of output current or variable maximum output current and/or a fixed setting of output voltage or variable maximum output voltage. Furthermore, the power adapter can be a switching power supply, a regulated transformer adapter or an unregulated transformer adapter.

In one example, the controllable power protection element is configured to limit the value of the electric current on reaching the first current limit value and/or reaching the second current limit value. This has the benefit that the flow of current to the electric consumer cannot be halted but, instead of that, can be continued at a reduced level of current and/or a reduced voltage in order to ensure an uninterrupted current supply to the electric consumer. Furthermore, the electric consumer can be protected against overcurrent, especially a short-circuit current, by a limiting of the electric current.

According to a second aspect, the disclosure relates to a method for overcurrent-protected supply of electric power to an electric consumer, comprising: providing electric current for the electric consumer from a power supply device; disabling the supply of electric current to the electric consumer by a controllable power protection element on reaching a first current limit value by the electric current, wherein the controllable power protection element further comprises an adjustable second current limit value from the power supply device, wherein the second current limit value is higher than the first current limit value; controlling the controllable power protection element by the power supply device for setting the second current limit value when recording a higher power requirement for the electric consumer within a time interval by the power supply device; and disabling the power input to the electric consumer on reaching the second current limit value within the time interval by use of the controllable power protection element.

In one example, the power supply device is configured to adapt to the first current limit value and/or the second current limit value. With that, the benefit is obtained that the power supply device can be adapted to specifications of different electric consumers and the energy supply apparatus can be used without changes in the hardware or other device properties of the energy supply apparatus for the power supply to different electric consumers. The current limit values can also be adapted during the operation of the energy supply apparatus, for example to follow the changing electric energy requirement of the electric consumer and/or to be able to trigger the controllable power protection element at any point in time because of an unexpected deviation.

In one example, the energy supply apparatus comprises a configuration interface, which is configured to receive a user input and forward to the power supply device, wherein the power supply device is configured to control the controllable power protection element based on the user input, in order to adapt the first current limit value and/or the second current limit value, especially in a range from 0 A to 30 A. This has the benefit that the energy supply apparatus can be efficiently configured and can be adapted to user-defined specifications. The configuration interface can be a haptic operating element, which has for example buttons and/or a pressure/touch-sensitive field allowing the user to make manual entries. The user input can be confirmed by an acknowledgement signal wherein the acknowledgement signal can be realised electronically, acoustically and/or visually.

The configuration interface can be an electronic configuration interface, which can be connected via a communication connection with a configuration device, which is especially located remotely from the energy supply apparatus. Therefore, the energy supply apparatus can be configured regardless of the location of the energy supply apparatus. The communication interface can be configured as a wireless or wired configuration device.

In one example, the controllable power protection element has a third current path, which is configured to conduct at least a part of the electric current from the electric energy source to a further electric consumer, wherein the controllable power protection element is configured to disable a flow of the electric current on reaching the first current limit value or the second current limit value or the sum of the currents in the first and second flow paths and the current in the third current flow path. This has the benefit that the energy supply apparatus can be used for supplying at least one further electric consumer. The values of current flowing to the respective electric consumer can be monitored as a sum in the energy supply apparatus so that the electric current supplied to the two consumers does not exceed a predetermined value of current. The third current path can be divided into two sub-paths, each of which comprises a circuit breaker, wherein a current sub-path sets the first current limit value and a further current sub-path sets the second current limit value.

The energy supply apparatus can be specified for the output of a determined electric power which can comprise the sum of the electric consumers connected to the energy supply apparatus. A triggering of the controllable power protection element by the sum of the electric current flowing to the electric consumers on reaching the first current limit value or the second current limit value can protect the energy supply apparatus against overload.

In one example, the controllable power protection element comprises a third current path, which is configured to conduct at least part of the electric current from the electric energy source to a further electric consumer, wherein the controllable power protection element is configured to prevent a flowing of electric current through the first current flow path or the second current path and/or the third current flow path on reaching the first current limit value or the second current limit value respectively due to the value of the current in the first or second current path respectively or by the current value in the third current path. This has the benefit that both of the electric consumers connected to the energy supply apparatus are independent of each other, especially regarding an overcurrent monitored and, if applicable, the current supply to the particular electric consumer can be disabled.

The controllable power protection element can be configured to disable the current supply to the electric consumer and maintain the current supply to the other electric consumers. Furthermore, the controllable power protection element can have a separate first current limit value and a second current limit value for each electric consumer to be able to connect electric consumers with different requirements to the energy supply apparatus and be able to supply with electric energy.

In addition to securing the first current path, the second current path and the third current path respectively, each with the first current limit value and the second current limit value, the controllable power protection element can additionally have a total current limit value so that the controllable power protection element disables the current supply to the electric consumers if the sum of the electric currents flowing to the electric consumers exceeds the total current limit value.

In one example, the power supply device is configured to control the controllable protection element when the electric current drops below the second current limit value in order to set the first current limit value. This has the benefit that the setting of the first current limit value can be reset before expiry of the maximum possible time in which the second current limit value can be set. This can, for example, raise the efficiency of energy supply apparatus.

BRIEF DESCRIPTION OF THE DRAWINGS

Examples of the present disclosure are explained under reference to the accompanying figures.

DETAILED DESCRIPTION

Figure 1:
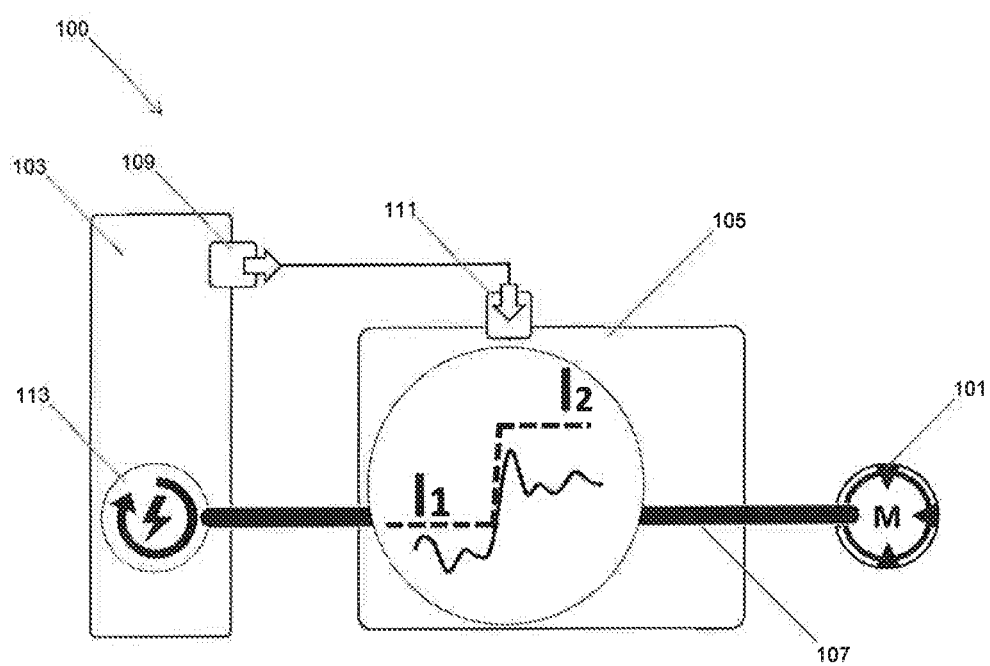
FIG. 1 shows an energy supply apparatus in an example.

FIG. 1 shows a schematic diagram of the energy supply apparatus 100 for the overcurrent-protected supply of electric power to an electric consumer 101. The energy supply apparatus 100 comprises a power supply device 103 that is configured to provide electric current for the electric consumer 101 and a controllable power protection element 105 that is configured to disable the supply of the electric current to the electric consumer 101 when a first current limit value is reached by the electric current. The controllable power protection element 105 further comprises a second current limit value which can be adjusted by the power supply device 103, wherein the second current limit value is greater than the first current limit value.

The power supply device 103 is also configured to receive an elevated power requirement for electric consumer 101 within a time interval and, in response to to the reception of the elevated power requirement, control the controllable power protection element 105 for the duration of the time interval for setting the second current limit value. The controllable power protection element 105 is configured to prevent the supply of the electric current to the electric consumer 101 upon reaching the second current limit value by the electric current.

The power supply device 103 is further configured to control the controllable power protection element 105 after expiry of the time interval for setting the first current limit value and the controllable power protection element 105 is configured to prevent the supply of the electric current with a set first current limit value to electric consumer 101 upon reaching the first current limit value by the electric current. The setting of the first current limit value or of the second current limit value can be done by the power supply device 103 if the power supply device 103 detects the higher power requirement of the electric consumer 101 by means of an increasing current amplitude and/or of a predetermined amplitude increase of the electric current.

The controllable power protection element 105 comprises a current path 107 which can be implemented by the electric current and wherein the controllable power protection element (105) is configured to set the first current limit value or the second current limit value in the current path (107).

Furthermore, the power supply device 103 is configured to adjust the time interval in order to adapt the period in which the current limit value is set by the controllable power protection element 105.

The power supply device 103 further comprises a control output 109 for outputting a control signal to set the respective current limit value by the controllable power protection element 105 and the controllable power protection element 105 comprises a control input 111 that is connected to the control output 109. The controllable power protection element 105 is further configured to set the relevant current limit value in response to the receipt of the control signal at the control input 111. The power supply device 103 also comprises a power adapter 113 which is configured to take the electric power from a power supply network and provide the electric power to the electric consumer 101.

Figure 2:
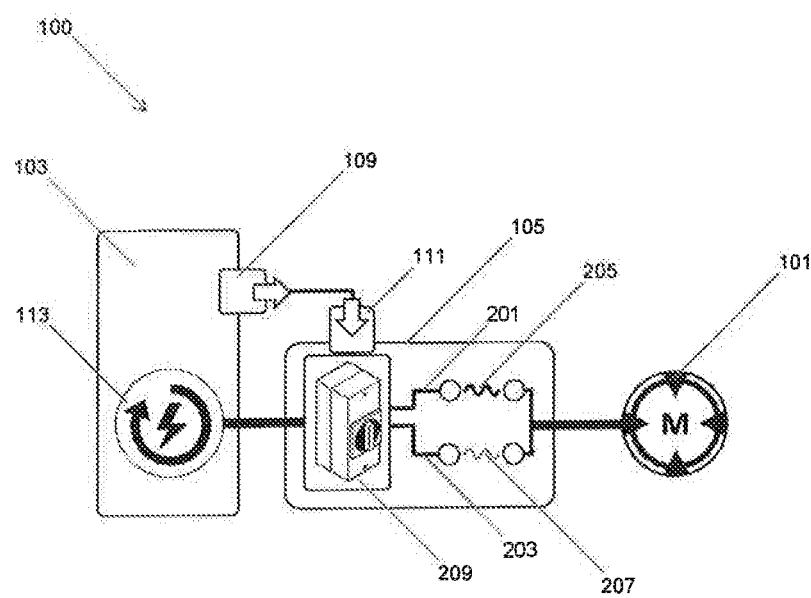
FIG. 2 shows an energy supply apparatus in an example.

FIG. 2 shows a schematic diagram of the energy supply apparatus 100 for supplying overcurrent protected electric power to the electric consumer 101. The energy supply apparatus 100 comprises a power supply device 103 that is configured to provide electric current for the electric consumer 101 and a controllable power protection element 105 that is configured to disable the supply of the electric current to the electric consumer 101 when a first current limit value is reached by the electric current. The controllable power protection element 105 further comprises a second current limit value which can be adjusted by the power supply device 103, wherein the second current limit value is greater than the first current limit value.

The power supply device 103 is also configured to receive an elevated power requirement of the electric consumer 101 within a time interval and, responding to the reception of the elevated power requirement, control the controllable power protection element 105 for the duration of the time interval for setting the second current limit value. The controllable power protection element 105 is configured to prevent the supply of the electric current to the electric consumer 101 upon reaching the second current limit value by the electric current.

The controllable power protection element 105 comprises a first current path 201 with the first current limit value and a second current path 203 with the second current limit value and is configured to interrupt the second current path 203 for setting the first current limit value and/or interrupt the first current path 201 for setting of the second current limit value. The controllable power protection element 105 comprises a first circuit breaker 205 with the first current limit value in the first current path 201 and a second circuit breaker 207 in the second current path 203 with the second current limit value. The power supply device 103 is configured to detect a boost mode of the electric consumer 101, in which the electric consumer has reached the increased power requirement within the time interval. The power supply device can especially comprise a power monitor that is configured to monitor the power requirement in order to receive the increased power requirement.

The controllable power protection element 105 further comprises a switch 209 that can be in particular an electronic or mechanical switch. The switch 209 is configured to connect, in a first switch position, the first current path 201 to the power supply device 103, in order to set the first current limit value and, in a second switch position, to connect the second current path 203 to the power supply device 103 in order to set the second current limit value.

LIST OF REFERENCE NUMBERS

100 Energy supply apparatus
101 Electric consumer
103 Power supply device
105 Controllable power protection element
107 Current path
109 Control output
111 Control input
113 Mains adapter
201 First current path
203 Second current path
205 First circuit breaker
207 Second circuit breaker
209 Switch

What is claimed is:

1. An energy supply apparatus for overcurrent-protected supply of electric power to an electric consumer, comprising:
  a power supply device configured to provide an electric current for the electric consumer; and
  a controllable power protection element configured to disable a supply of electric current to the electric consumer when the electric current reaches a first current limit value;
  wherein the controllable power protection element comprises an adjustable second current limit value set by the power supply device;
  wherein the second current limit value is higher than the first current limit value, wherein the power supply device is further configured to receive an increased power requirement of the electric consumer within a time interval and, in response to receiving the increased power requirement, to control the controllable power protection element for a duration of the time interval to set the second current limit value; and
  wherein the controllable power protection element is configured, at the set second current limit value, to disable the supply of the electric current to the electric consumer upon reaching the second current limit value by the electric current.

2. The energy supply apparatus according to claim 1, wherein the power supply device is configured to control the controllable power protection element after expiry of the time interval to set the first current limit value, and wherein the controllable power protection element is configured to disable the supply of the electric current to the electric consumer when the electric current reaches the first current limit value.

3. The energy supply apparatus according to claim 1, wherein the power supply device is configured to detect the increased power requirement during an increasing current amplitude of the electric current.

4. The energy supply apparatus according to claim 3, wherein the power supply device is configured to detect the increased power requirement during the increasing current amplitude of the electric current when an amplitude increase does not exceed a predetermined incremental limit value.

5. The energy supply apparatus according to claim 1, wherein the controllable power protection element comprises a current path of the electric current, and wherein the controllable power protection element is configured to set the first current limit value or the second current limit value in the current path.

6. The energy supply apparatus according to claim 5, wherein the controllable power protection element comprises a controllable circuit breaker arranged in the current path, wherein the controllable circuit breaker is configured to set the first current limit value or the second current limit value.

7. The energy supply apparatus according to claim 1, wherein the controllable power protection element comprises a first current path with the first current limit value and a second current path with the second current limit value, and wherein the controllable power protection element is configured to interrupt the second current path to set the first current limit value and interrupt the first current path to set the second current limit value.

8. The energy supply apparatus according to claim 7, wherein the controllable power protection element comprises a first circuit breaker with the first current limit value in the first current path and a second circuit breaker with the second current limit value in the second current path.

9. The energy supply apparatus according to claim 1, wherein the power supply device is configured to detect a boost mode of the electric consumer, wherein the boost mode is when the electric consumer has reached the increased power requirement within the time interval.

10. The energy supply apparatus according to claim 1, wherein the power supply device comprises a power monitor configured to monitor a power requirement to receive the increased power requirement.

11. The energy supply apparatus according to claim 1, wherein the power supply device comprises a control output configured to output a control signal to set the respective current limit value by the controllable power protection element, wherein the controllable power protection element comprises a control input and wherein the control output is connected to the control input, and wherein the controllable power protection element is configured to set the relevant current limit value in response to a receipt of the control signal at the control input.

12. The energy supply apparatus according to claim 1, wherein the power supply device is configured to adapt the time interval to adapt a period that the first or the second current limit value is set by the controllable power protection element.

13. The energy supply apparatus according to claim 1, wherein the power supply device further comprises a power adapter configured to receive the electric power from a mains supply network and provide the electric power for the electric consumer.

14. The energy supply apparatus according to claim 1, wherein the controllable power protection element is configured to limit a value of the electric current upon reaching the first current limit value and reaching the second current limit value.

15. A method for overcurrent-protected supply of electric power to an electric consumer, comprising:
- providing, by a power supply device, an electric current configured for the electric consumer;
- preventing, by a controllable power protection element, a supply of the electric current to the electric consumer when the electric current reaches a first current limit value, wherein the controllable power protection element comprises an adjustable second current limit value set by the power supply device, wherein the second current limit value is higher than the first current limit value;
- controlling, by the power supply device, the controllable power protection element to set the second current limit value based at least in part on receiving, by the power supply device, an increased power requirement of the electric consumer within a time interval; and
- disabling, by the controllable power protection element, the supply of the electric current to the electric consumer upon reaching the second current limit value within the time interval.

* * * * *